United States Patent [19]

Iwano et al.

[11] Patent Number: 5,179,566
[45] Date of Patent: Jan. 12, 1993

[54] LIGHT-GENERATING DEVICE AND METHOD OF FABRICATING SAME

[75] Inventors: Hideaki Iwano; Yasuji Yamazaki; Katsuhiko Teraishi, all of Nagano, Japan

[73] Assignee: Seiko Epson Corporation, Tokyo, Japan

[21] Appl. No.: 469,475
[22] PCT Filed: Aug. 22, 1989
[86] PCT No.: PCT/JP89/00852
§ 371 Date: Apr. 30, 1990
§ 102(e) Date: Apr. 30, 1990
[87] PCT Pub. No.: WO90/03055
PCT Pub. Date: Mar. 22, 1990
[51] Int. Cl.[5] .............................. H01S 3/19
[52] U.S. Cl. ..................... 372/45; 372/49; 372/22; 372/43; 359/328; 385/130
[58] Field of Search ............. 372/46, 22, 49, 43; 385/130, 122; 359/328

[56] References Cited

U.S. PATENT DOCUMENTS 4,821,275  4/1989  Nakatsuka et al. ................ 372/46
5,033,810  7/1991  Inoue et al. ...................... 385/122
5,073,725  12/1991  Takano et al. .................... 385/130

FOREIGN PATENT DOCUMENTS 62-86881  4/1987  Japan ............................... 372/46
63-050928  3/1988  Japan .
63-94230  4/1988  Japan ............................... 372/46
63-164379  7/1988  Japan .

OTHER PUBLICATIONS

"Second Harmonic Light Wave Generation From DFB Lasers", *Xerox Disclosure Journal*, Robert D. Burnham, et al., vol. 4, No. 3, May/Jun. 1979, pp. 365-366.
"Improvement of frequency-conversion efficiency in waveguides with rotationally twinned layers", *Optics Letters*, Jul. 1988, vol. 13, No. 7, pp. 603-605.

*Primary Examiner*—Léon Scott, Jr.
*Attorney, Agent, or Firm*—Spensley Horn Jubas & Lubitz

[57] ABSTRACT

A quite small device producing blue light with small loss of light. The device has a laminated laser light-emitting portion and an optical waveguide for second-harmonic generation. Both light-emitting portion and waveguide are formed on the same semiconductor substrate. The waveguide takes the form of a thin laminated layer. The laser light-emitting portion and the waveguide are substantially flush with each other.

20 Claims, 5 Drawing Sheets

LIGHT-GENERATING DEVICE AND METHOD OF FABRICATING SAME

TECHNICAL FIELD

The present invention relates to an integrated device for generating the second harmonic of a semiconductor laser radiation and also to a method of fabricating such an integrated device. Further, the invention relates to applied devices.

BACKGROUND ART

A conventional device for generating the second harmonic of a semiconductor laser radiation is described in Japanese Patent Laid-Open No. 142,284/1976. This known device is shown in FIG. 10 and is a hybrid integrated device consisting of a semiconductor laser 1001 of AlGaAs and a device 1002 for second-harmonic generation. The device 1002 is a thin-film optical waveguide made from $LiNbO_3$ or the like. The laser radiation of wavelength 870 nm emitted by the semiconductor laser 1001 enters the device 1002 for second-harmonic generation. Then, the radiation is converted into a wavelength half the wavelength of the laser radiation, i.e., 435 nm, by the nonlinear optical effect of the thin film of $LiNbO_3$ and emitted as an outgoing radiation 1003.

Another known device for generating the second harmonic of a semiconductor laser radiation is described in Japanese Patent Laid-Open No. 112,023/1985 and shown in FIG. 11. This device is a hybrid integrated device consisting of a semiconductor laser 1101 of AlGaAs and a device 1102 for second-harmonic generation. The device 1102 is a thin-film optical waveguide of $LiNbO_3$ or the like. A condenser lens 1103 is mounted between them to efficiently introduce the light from the laser into the optical waveguide. If the incident spot matches the waveguide, then the optical density inside the waveguide can be increased. This enhances the efficiency at which the laser light is converted into the half wavelength.

These prior art techniques have the following problems. In the device shown in FIG. 10, it is quite difficult to make the lasing active layer flush with the thin-film optical waveguide. In addition, their positional relation is easily affected by variations in the ambient temperature and other variations. If their positional integrity is lost at all, then the laser light is not introduced into the waveguide. Further, the efficiency of coupling to the waveguide is low, because the emitted semiconductor laser radiation is spread out. This also leads to a reduction in the conversion efficiency.

In the device shown in FIG. 11, the optical density inside the optical waveguide of a thin film can be increased by the condenser lens. In this case, it is necessary to focus the laser radiation onto the waveguide having a thickness of the order of 1 μm. Therefore, the alignment is very difficult to perform. Furthermore, the positional integrity is easily destroyed by variations in the ambient temperature.

Accordingly, it is an object of the present invention to provide a monolithic integrated device which consists of a semiconductor laser and a device for second-harmonic generation, and in which the laser radiation is coupled to the device for second-harmonic generation at a high efficiency, the optical density in the optical waveguide of the thin film being high, the integrated device converting the laser radiation into the second harmonic at a high efficiency, the coupling efficiency being unaffected by environmental variations.

It is another object of the invention to provide a method of fabricating the integrated device described just above.

DISCLOSURE OF THE INVENTION

In one feature of the invention, a device generating light comprises a semiconductor substrate, a laminated laser radiation-emitting portion formed on the substrate, and an optical waveguide that is made of a thin film and generates the second harmonic of the laser radiation, the laser radiation-emitting portion being disposed substantially flush with the optical waveguide.

In another feature of the invention, a laminated laser radiation-emitting portion and an optical waveguide made of a thin film are formed on the same semiconductor substrate, the waveguide generating the second harmonic of the laser radiation, the laser radiation-emitting portion being disposed substantially flush with the waveguide, one end surface of the emitting portion being in contact with one end surface of the waveguide.

In a further feature of the invention, a laminated laser radiation-emitting portion and an optical waveguide made of a thin film are formed on the same semiconductor substrate, the waveguide generating the second harmonic of the laser radiation, the laser radiation-emitting portion being disposed substantially flush with the waveguide, at least one of the opposite end surfaces of the emitting portion and the waveguide being coated with a dielectric film having a thickness giving an optical length equal to half the oscillation wavelength of the emitting portion.

In a yet other feature of the invention, a laminated laser radiation-emitting portion and an optical waveguide made of a thin film are formed on the same semiconductor substrate, the waveguide generating the second harmonic of the laser radiation, the emitting portion being disposed substantially flush with the waveguide, the opposite end surfaces of the emitting portion and the waveguide being spaced from each other by a distance equal to half the oscillation wavelength of the laser radiation-emitting portion.

In a still other feature of the invention, said laser radiation-emitting portion is made of a thin film of a semiconductor crystal of Group III–V compounds, while said optical waveguide for second-harmonic generation is made of a thin film of a semiconductor crystal of Group II–VI compounds.

In an additional feature of the invention, said optical waveguide for second-harmonic generation consists of a ridged stripe formed on the semiconductor substrate.

In a yet other feature of the invention, said optical waveguide for second-harmonic generation comprises a cladding layer consisting of a semiconductor of Group II–VI compounds and an optical waveguide of a nonlinear optical medium consisting of a semiconductor of Group II–VI compounds, the latter semiconductor having a smaller band gap than the semiconductor forming the cladding layer.

In a still further feature of the invention, said optical waveguide for second-harmonic generation has the ridged stripe and comprises the cladding layer and the nonlinear optical waveguide, the stripe being surrounded by a semiconductor which consists of Group II–VI compounds and has a smaller refractive index than that of the semiconductor forming the waveguide.

In a yet further feature of the invention, the thickness of said nonlinear optical waveguide is set such that the fundamental and the second-harmonic waves are matched in phase.

In an additional further feature of the invention, said optical waveguide for second-harmonic generation is formed in a channel which is formed in the semiconductor substrate, the waveguide being substantially flush with the surface of the substrate.

In a yet additional feature of the invention, an optical resonator for emitting laser radiation is made of a reflecting mirror having two opposite end surfaces, the mirror containing a laser radiation-emitting portion and an optical waveguide for second-harmonic generation.

In a supplementary feature of the invention, said optical waveguide for second-harmonic generation has a multilayer superlattice structure consisting of a semiconductor of Group II-VI compounds.

In a still supplementary feature of the invention, said semiconductor laser has a double heterojunction structure comprising an active layer, a cladding layer, and a contact layer, the active layer consisting of a semiconductor of Group III-V compounds, the double heterojunction structure having a ribbed stripe which is formed by etching away the cladding layer overlying the active layer up to its half depth, both side ends of the rib being buried in the layer of the semiconductor of the Group II-VI compounds.

In a further supplementary feature of the invention, said layer of the semiconductor of the Group III-V compounds consists of a mixed crystal of AlGaAs.

In a yet supplementary feature of the invention, said layer of the semiconductor of the Group III-V compounds consists of a mixed crystal of InGaAsP.

The inventive method of fabricating a device generating light is characterized in that said optical waveguide for second-harmonic generation is formed out of a semiconductor of Group II-VI compounds by selective epitaxial growth.

In another feature of the invention, said selective epitaxial growth is metal organic chemical vapor deposition using organic compounds belonging to Groups II and VI, respectively, as raw materials.

In a further feature of the invention, said chemical vapor deposition is conducted in the conditions: (1) the temperature of the substrate on which the thin film of the semiconductor of the Group II-VI compounds is grown is between 300° C. and 700° C.; (2) the pressure of reacting gas is less than 300 torr; and (3) the molar ratio of the supplied Group VI material to the supplied Group II material is less than 6.

In a still other feature of the invention, the novel method comprises the steps of: growing a crystal of said double heterojunction structure on a semiconductor substrate; etching away a part of the double heterojunction structure including the active layer vertically to the surface of the substrate; forming a dielectric film on the etched surface of the substrate; etching the dielectric film into a stripe in the direction of the oscillation of laser; and growing a crystal of the semiconductor of the Group II-VI compounds only on the stripe by the metal organic CVD.

An optical memory according to the invention uses a light-generating device as a light source, the device comprising a laminated laser radiation-emitting portion formed on a semiconductor substrate and an optical waveguide formed on the substrate, the laser radiation-emitting portion consisting of a semiconductor of Group III-V compounds, the waveguide being made of a thin film consisting of a semiconductor of Group II-VI compounds, the waveguide acting to generate the second harmonic of the laser radiation, the laser radiation-emitting portion and the optical waveguide being substantially flush with each other.

Figure 1:
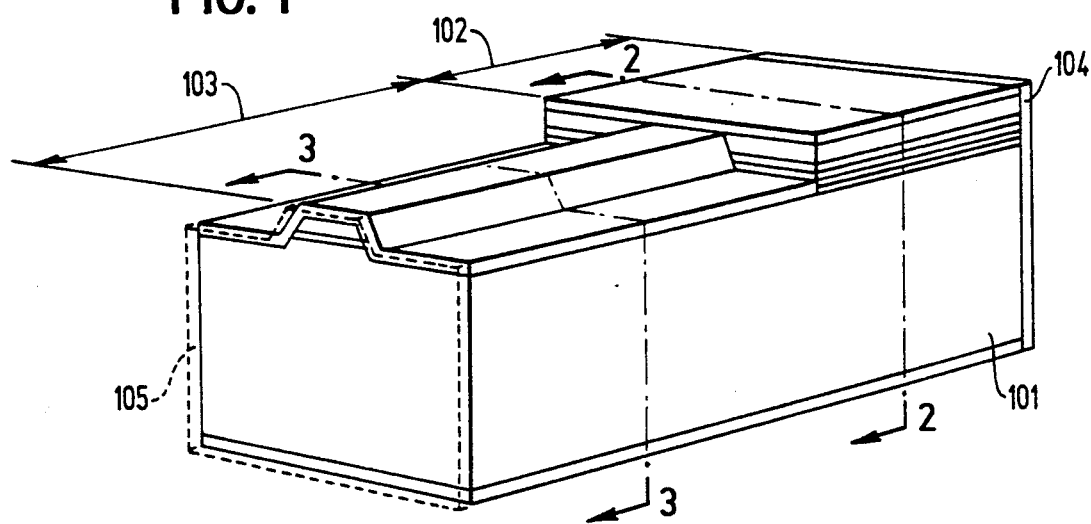
FIG. 1 is a perspective view of a light-generating device according to the invention.

101, 201, 301, 401, 501, 601, 801: single crystal substrates of n-type GaAs
102, 402: semiconductor lasers
103, 403: optical waveguides for second-harmonic generation
104: multilayer dielectric film
105: dielectric film
202, 602, 802: n-type GaAs buffer layers
203, 603, 803: n-type $Al_xGa_{1-x}As$ cladding layers
204, 604, 804: GaAs active layers
205, 605, 805: p-type $Al_xGa_{1-x}As$ cladding layers
206, 502, 807: burying layers of $ZnS_xSe_{1-x}$
207, 606, 806: p-type GaAs contact layers
208: p-type ohmic electrode
209: n-type ohmic electrode
302, 304, 608, 610: $ZnS_xSe_{1-x}$ cladding layers
303, 609: ZnSe nonlinear optical waveguide layers
305: $ZnS_xSe_{1-x}$ layers
701, 703: ZnS cladding layers
702: multilayer superlattice nonlinear optical waveguide layer
901: device emitting blue light
902: collimator lens
903: diffraction grating
904: half prism
905: condenser lens
906: optical memory disk
1001, 1101: semiconductor lasers
1002, 1102: devices for second-harmonic generation
1003: outgoing light 1103: condenser lens

BEST MODE FOR CARRYING OUT THE INVENTION

Referring to FIG. 1, there is shown a monolithic integrated device according to the invention. The integrated device comprises an n-type GaAs substrate 101, a double heterojunction semiconductor laser 102 consisting of $Al_xGa_{1-x}As$, and a ridged optical waveguide 103 consisting of $ZnS_xSe_{1-x}$. The laser 102 and the waveguide 103 are formed on the substrate 101. One end surface of the laser 102 is in contact with one end surface of the waveguide 103. A multilayer dielectric film 104 which shows a high reflectivity for the wavelength $\lambda$ of the laser radiation is formed on the rear surface of the laser 102. A dielectric film 105 that transmits wavelength $\lambda/2$ is formed on a side end surface of the waveguide 103. A laser resonator is formed between the reflecting mirrors of these dielectric films. The density distribution is such that the optical energy inside the waveguide 103 is high.

Figure 2:
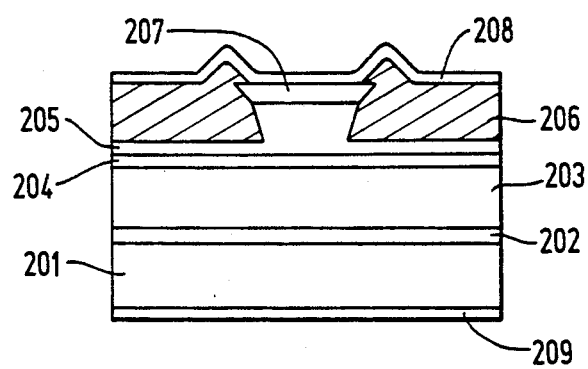
FIG. 2 is a cross section taken along line 2—2 of FIG. 1, for showing the structure of the semiconductor laser portion of the light-generating device.
Figure 3:
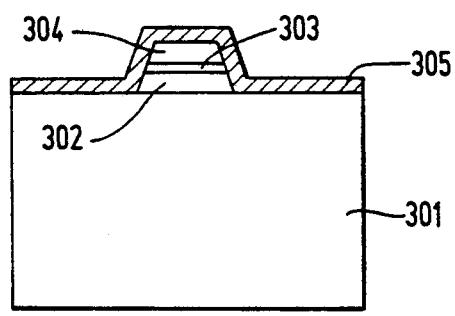
FIG. 3 is a cross section taken along line 3—3 of FIG. 1, for showing the structure of the second harmonic-generating optical waveguide portion of the light-generating device.

FIG. 2 is a cross section taken along line 2—2 through the semiconductor laser 102. FIG. 3 is a cross section taken along line B—B' through the optical waveguide 103. The structure of the semiconductor laser shown in FIG. 2 is now described. This laser comprises a substrate 201 of an n-type GaAs single crystal, a buffer layer 202 of n-type GaAs formed on the substrate 201, a cladding layer 203 of n-type $Al_xGa_{1-x}As$ (x=0.35) formed on the buffer layer 202, an active layer 204 of GaAs formed on the cladding layer 203, another cladding layer 205 formed on the active layer 204, and a contact layer 207 of p-type GaAs. The cladding layer 205 takes the form of a rib, is of inverted mesa type, and consists of p-type $Al_xGa_{1-x}As$ (x=0.35). Both ends of the rib are buried in a three-dimensional mixture crystal 206 of a semiconductor $ZnS_xSe_{1-x}$ (x=0.06) of Group II-VI compounds.

The $ZnS_xSe_{1-x}$ layer on the upper surface of the contact layer 207 is etched away. Instead, a p-type ohmic electrode 208 is formed. An n-type ohmic electrode 209 is formed on the lower surface of the substrate 201. Forward electric current is caused to flow between the electrodes 208 and 209 to inject electric charges into the active layer 204. When charge carriers recombine, light is emitted. This light is amplified between the end surfaces of the resonator. As a result, a laser radiation is emitted.

Since the $ZnS_xSe_{1-x}$ layer 206 has a specific resistance exceeding 10 M$\Omega$·cm, the injected current hardly flows except for the location of the rib. Therefore, the laser oscillation occurs only in the active layer located just under the rib, thus reducing the threshold current for oscillation. The threshold current will be denoted by $I_{th}$. The refractive index of $ZnS_xSe_{1-x}$ (x=0.06) is 2.53, which is less than the refractive index 3.4 of GaAs.

In the semiconductor laser shown in FIG. 2, there exists an effective step of refractive index between the lasing region and the mixed crystal layer 206 of $ZnS_xSe_{1-x}$ (x=0.06) in which both ends of the rib are buried. Consequently, the laser radiation is effectively confined within the lasing region. This also reduces the threshold current $I_{th}$. In addition, the differential quantum efficiency can be improved. Because of these effects, the value of the driving current can be reduced, and high-power light emission of the semiconductor laser is allowed. Hence, the power of the produced second harmonic can be increased.

Since $ZnS_xSe_{1-x}$ agrees in lattice constant with $Al_xGa_{1-x}As$, it is unlikely that dislocation or other undesirable phenomenon takes place at the interface due to the unmatched lattice constants. For this reason, a crystal of quite high quality is obtained. Thus, loss of injected carriers and loss of the light in the waveguide are prevented. Because of these various advantages, the threshold current $I_{th}$ of the semiconductor laser is as low as 15 to 20 mA. The output of oscillation at wavelength of 870 nm is in excess of 100 mW.

The cross-sectional structure of the optical waveguide for second-harmonic generation is next described by referring to FIG. 3. This ridged optical waveguide comprises a substrate 301 of n-type GaAs, a cladding layer 302 formed on the substrate 301 and consisting of $ZnS_xSe_{1-x}$ (x=0.5 to 1.0), a nonlinear optical waveguide layer 303 of ZnSe, and a cladding layer 304 of $ZnS_xSe_{1-x}$ (x=0.5 to 1.0). The whole is covered with a layer 305 of $ZnS_xSe_{1-x}$ (x=0.1). The waveguide layer 303 exactly or substantially coincides in position with the GaAs active layer 204 shown in FIG. 2. Therefore, the laser radiation enters the waveguide layer 303 with substantially no loss. While the incident light is propagating through the ridged stripe, it interferes nonlinearly with the medium of ZnSe to produce the second harmonic having a wavelength half the wavelength of the incident light. In the present example, the wavelength of the incident light was 870 nm, and blue coherent light of wavelength 435 nm was obtained. The conversion efficiency was between 5% and 7%. When the semiconductor laser was oscillated at 100 mW, blue light of 5 to 7 mW was derived. In order to cause sufficient nonlinear interaction of the light, it is necessary that the optical energy density within the optical waveguide be sufficiently large. In the present example, the light is confined also in the direction of the face of the substrate, because the waveguide is a thin film and assumes the form of a ridged stripe. Consequently, a large optical energy density could be produced.

Since the layer of ZnSe and the layer of $ZnS_xSe_{1-x}$ are each made of a thin film of a single crystal, the loss of the blue light at the exit end surface and in the waveguide is small. This also enhances the conversion efficiency.

The semiconductor laser and the optical waveguide are formed in such a way that they are spaced from each other. A film of $Al_2O_3$ is coated on each of the opposite end surfaces of the laser and the waveguide. If the thickness of each $Al_2O_3$ film is equal to half the oscillation wavelength 870 nm of the laser divided by the refractive index 1.76 of $Al_2O_3$, i.e., 247 nm, then no reflection loss occurs on this surface. This further increases the total efficiency. Similar advantage can be obtained by spacing the semiconductor laser and the optical waveguide by a distance equal to half the oscillation wavelength.

To permit sufficient nonlinear interaction of light, the optical energy density must be high as described above. In addition, the fundamental wave must coincide in phase velocity with the second harmonic wave within the medium. This requirement is called phase matching and can be satisfied by appropriately selecting the thickness of the nonlinear optical waveguide layer. In the present example, the refractive index of the ZnS cladding layer is 2.32 at wavelength 870 nm. The refractive index of the nonlinear medium of ZnSe is 2.53 at wavelength 870 nm. The step of refractive index approximates 10%. Thus, by setting the thickness of the ZnSe layer to 800 Å, the phase can be matched between $TE_0$ mode of the fundamental wave and $TE_1$ mode of the second harmonic.

The ridged stripe is coated with a layer 305 of $ZnS_xSe_{1-x}$ (x=0.1). A refractive index step of 0.01 exists in the direction of the plane of the substrate. The blue light is radiated with a single spot.

Figure 4:
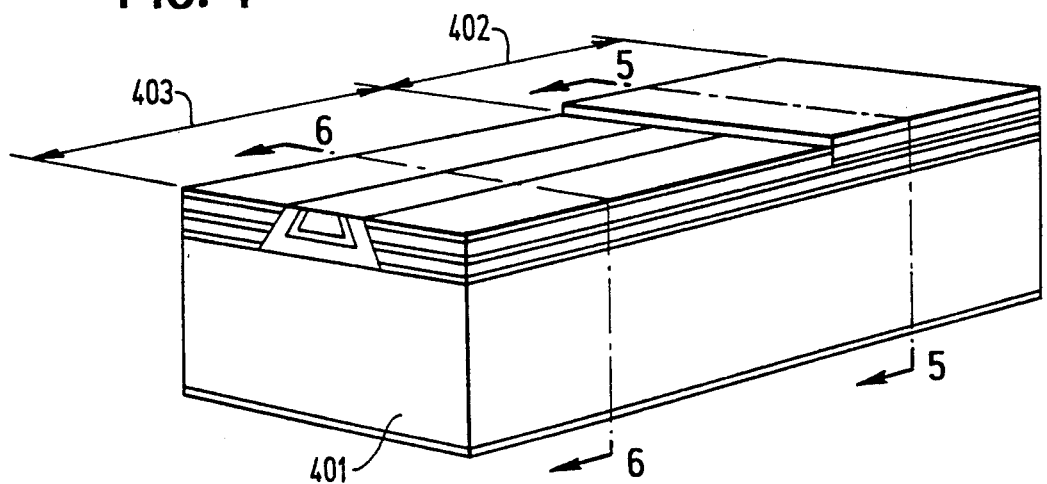
FIG. 4 is a perspective view of another light-generating device according to the invention.
Figure 5:
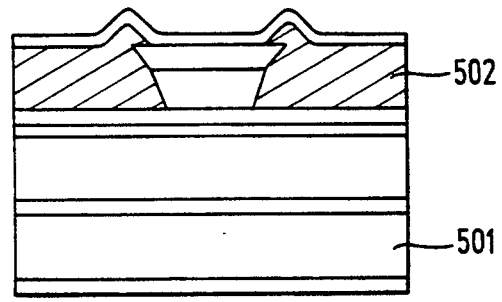
FIG. 5 is a cross section taken along line 5—5 of FIG. 4, for showing the structure of the semiconductor laser portion of the light-generating device.
Figure 6:
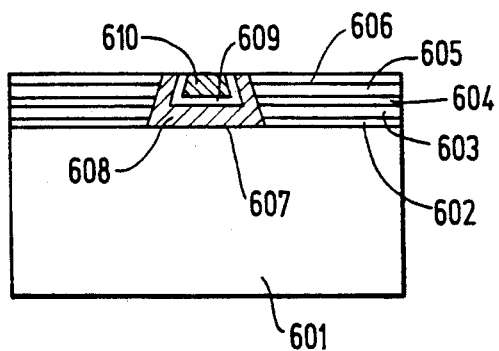
FIG. 6 is a cross section taken along line 6—6 of FIG. 4, for showing the structure of the second harmonic-generating optical waveguide portion of the light-generating device.

Another device according to the invention is next described by referring to FIG. 4. This device is a monolithic integrated device comprising a substrate 401 of n-type GaAs, a double heterojunction semiconductor layer 402 consisting of $Al_xGa_{1-x}As$ and formed on the substrate, and a buried optical waveguide 403 consisting of $ZnS_xSe_{1-x}$. FIG. 5 shows a cross section taken along line 2—2, for showing the cross-sectional structure of the semiconductor laser. FIG. 6 shows a cross section taken along line 3—3, for showing the cross-sectional structure of the optical waveguide. The semiconductor laser is identical in cross-sectional structure with the laser already described in connection with FIG. 2.

Referring to FIG. 6, the optical waveguide is formed by forming a buffer layer 602 of n-type GaAs, a cladding layer 603 of n-type $Al_xGa_{1-x}As$ (x=0.35), an active layer 604 of GaAs, a p-type cladding layer 605 of $Al_xGa_{1-x}As$ (x=0.35), and a p-type GaAs cladding layer 606 on an n-type GaAs substrate 601. The laminate has a double heterojunction. A channel 607 is formed. Then, a thin-film optical waveguide layer comprising a cladding layer 608 of $ZnS_xSe_{1-x}$ (x=0.5 to 1.0), a nonlinear optical waveguide layer 609 of ZnSe, and a cladding layer 610 of $ZnS_xSe_{1-x}$ (x=0.35) is formed. Since the waveguide layer 609 is flush with the GaAs active layer 604, the light radiated from the laser 402 is introduced into the waveguide layer substantially without loss. In the present example, a sufficiently large optical energy density can be obtained in the waveguide.

There is a refractive index step in the direction of the face of the substrate due to the curvature of the optical waveguide. Light is confined also in this direction. In this example, since the wavelength of the incident light was 870 nm, blue coherent light of wavelength 435 nm was obtained. The conversion efficiency was between 6% and 8%. When the semiconductor laser was oscillated at 100 mW, blue light of 6 to 8 mW was produced.

Figure 7:
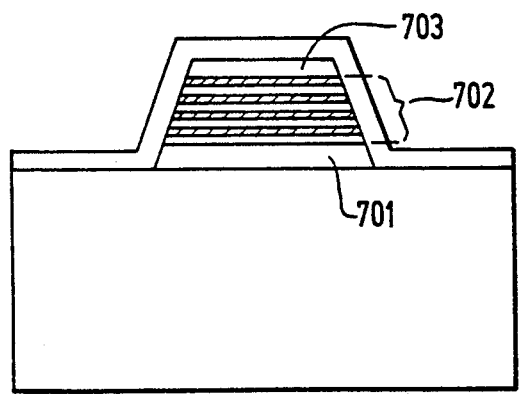
FIG. 7 is a cross-sectional view of the second harmonic-generating optical waveguide portion of a further light-generating device according to the invention.
Figure 8A:
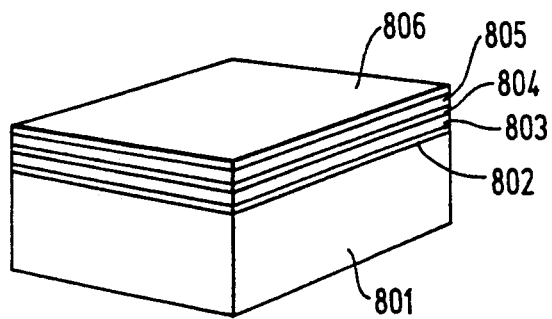
FIGS. 8(a)-(g), shows steps performed to fabricate a light-generating device according to the invention.
Figure 8B:
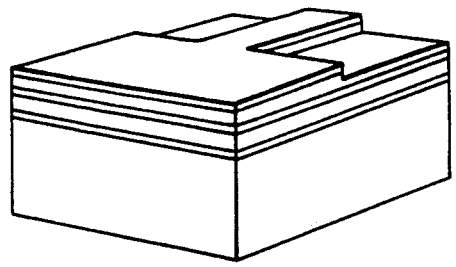
Figure 8C:
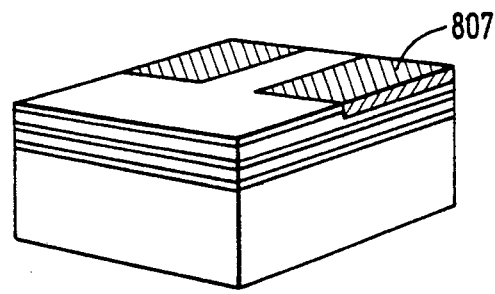
Figure 8D:
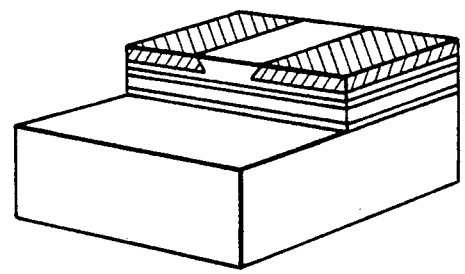
Figure 8E:
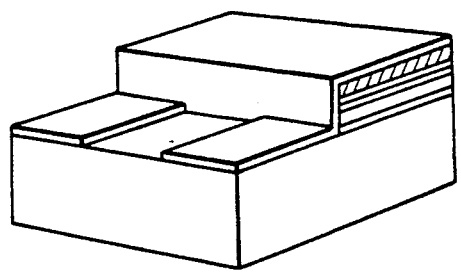
Figure 8F:
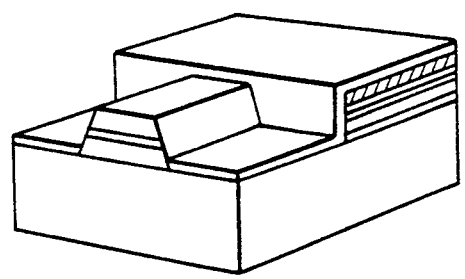
Figure 8G:
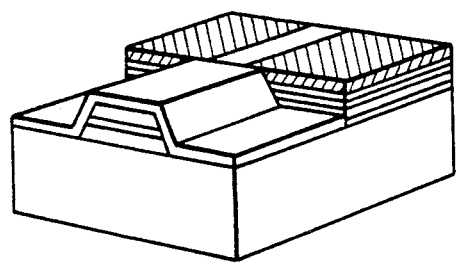

FIG. 7 shows the cross section of the nonlinear optical waveguide of another device according to the invention. The semiconductor laser of this example is exactly the same as the laser shown in FIG. 2. Similarly to the structure shown in FIG. 3, a nonlinear optical waveguide layer 702 is sandwiched between cladding layers 701 and 703 of ZnS. In this example, the cladding layer 702 has a multilayer superlattice structure consisting of ZnSe and $ZnS_xSe_{1-x}$ (x=0.5). In particular, a layer of ZnSe of 100 Å thick and a layer of $ZnS_xSe_{1-x}$ of 100 Å thick are alternately stacked on each other such that each layer repeats itself four times. Because of this superlattice structure, the secondary nonlinear optical constant is improved, and the efficiency of generation of the second harmonic is improved. In the present example, blue coherent light of wavelength 475 nm was obtained at a conversion efficiency of 9 to 10%. The total thickness of the multilayer superlattice is 800 Å. In the same way as in the above example, the phase matching is met, thus permitting nonlinear interaction.

In the above example, the semiconductor laser has an oscillation wavelength of 870 nm and made from AlGaAs. If a double heterojunction formed by GaInAsP and InP is used, the oscillation wavelength is 1 to 1.5 μm. With a structure similar to the structure of the above example, coherent light of wavelength of 500 to 750 nm, i.e., from green to red, is obtained.

A method of fabricating the above-described device generating blue light is now described by referring to FIG. 8. A layer 802 of n-type GaAs, a cladding layer 803 of n-type $Al_xGa_{1-x}As$ (x=0.35), an active layer 804 of GaAs, a p-type $Al_xGa_{1-x}As$ (x=0.35) cladding layer 805, and a p-type GaAs contact layer 806 are successively grown on a substrate 801 of an n-type GaAs single crystal by liquid phase epitaxial growth, metal organic chemical vapor deposition (MOCVD), or molecular beam epitaxy (MBE) (FIGS. 8-a). MOCVD can offer uniform thickness of film, permits growth of extremely thin films, and enables mass-production. In the present example, the crystals are grown by MOCVD. As Group III elements, trimethyl gallium and trimethyl aluminum are used. $AsH_3$ gas is employed as a Group V element. High-purity hydrogen is passed through a film of palladium and introduced as a carrier gas into a reaction tube, where the aforementioned raw materials are placed. The substrate of GaAs is placed on a graphite susceptor and heated by RF induction heating. The temperature of the substrate is 700° C. to 800° C. while the films are being grown. The pressure inside the reaction tube is 70 to 200 torr. The n-type dopant is Se, while the p-type dopant is Zn. Then, both ends of the ribbed stripe of the semiconductor laser is etched away up to an intermediate depth in the p-type cladding layer 805 except for the rib (FIGS. 8-b). Both side ends of the rib are buried in the layer 807 of $ZnS_xSe_{1-x}$ (FIGS. 8-c) by selectively epitaxially growing $ZnS_xSe_{1-x}$ by MOCVD. A thin film of $SiO_2$ is left on the upper surface of the ribbed stripe. Under this condition, a layer of dimethylzinc, dimethylselenium, and dimethylsulfur is grown by MOCVD. The temperature of the substrate is 600° C. The pressure of the reacting gas is 70 torr. The mixture of dimethyl selenium and dimethylsulfur and dimethylzinc are supplied at a molar ratio of 1:2. No material is deposited on the film of $SiO_2$. A crystal grows only at side ends of the rib. Therefore, the rib is embedded flatly. By etching away the film of $SiO_2$, a contact can be made. Then, the laminate including the active layer 804 is etched except for the semiconductor laser (FIGS. 8-d). In order to reduce the loss of the light, it is necessary that the etched surface of the active layer be a vertical cross section and smooth. For this purpose, the etching process is performed by reactive ion beam etching using a beam of chlorine ions. The end surfaces are formed by anisotropic etching. Since the active layer is etched in the direction of movement of the ion beam, a vertical smooth cross section is produced. A thin film of $SiO_2$, $Si_3N_4$, or other dielectric is formed over the whole vertical surface. The dielectric film is etched away along the stripe of the semiconductor laser to form a stripe having a substantially uniform width (FIGS. 8-e). Then, a crystal of a semiconductor of Group II–VI compounds is grown only on the stripe by selective epitaxy using the aforementioned metal organic CVD (FIGS. 8-f). As no material is deposited on the dielectric film, the thin film is shaped into a ridged stripe as shown in FIGS. 8-f. The selective epitaxy is carried out similarly to the foregoing process. That is, dimethylzinc and dimethylselenium are used as raw materials. The temperature of the substrate is 300° to 700° C. The pressure of the reacting gas is less than 300 torr. The molar ratio of the supplied mixture of dimethylselenium and dimethylsulfur to the supplied dimethylzinc is less than 6. Under these conditions, the selective epitaxy described above is possible. A cladding layer of $ZnS_xSe_{1-x}$ (x=0.5 to 1.0), a nonlinear optical waveguide layer of ZnSe and a cladding layer of $ZnS_xSe_{1-x}$ (x=0.5 to 1.0) are successively grown epitaxially. The composition of $ZnS_xSe_{1-x}$ can be set at will by adjusting the molar ratio of the supplied raw materials. In this way, {111} crystal surface is formed on the side surfaces of the grown ridged stripe, so that flat side walls are formed.

This reduces scattering of the guided light on the side surfaces, resulting in an increase in the efficiency of second-harmonic generation. Subsequently, a layer of $ZnS_xSe_{1-x}$ (x=0.1) is formed on the optical waveguide by MOCVD in the same way as in the process described above. As a result, the refractive index becomes nonuniform horizontally (FIGS. 8-g). Then, p- and n-type electrodes are formed to create a device emitting blue light.

Where the nonlinear optical waveguide layer is made to have a superlattice structure, a layer of ZnSe of 100 Å thick and a layer of $ZnS_xSe_{1-x}$ of 100 Å thick are alternately grown. Since a steep interface can be formed by MOCVD, a nonlinear optical waveguide having a large nonlinear optical constant can be realized.

Where the nonlinear optical waveguide is buried, after the laser is formed, a channel is formed. Then, a cladding layer is selectively grown epitaxially to bury the nonlinear optical waveguide layer.

Figure 9:
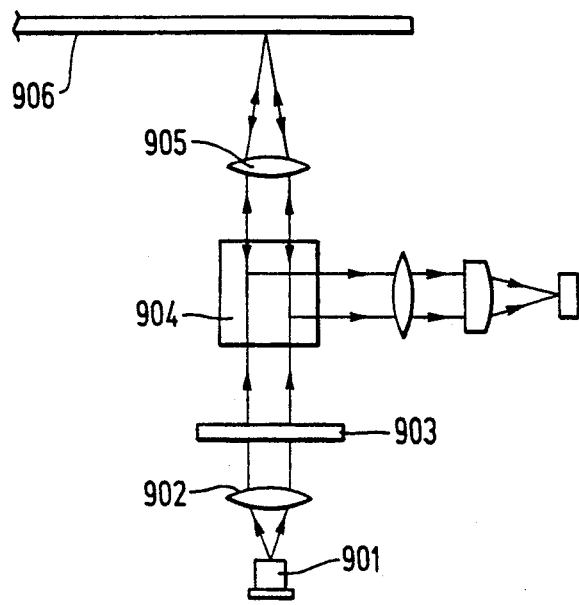
FIG. 9 is a schematic diagram of an optical memory according to the invention.
Figure 10:
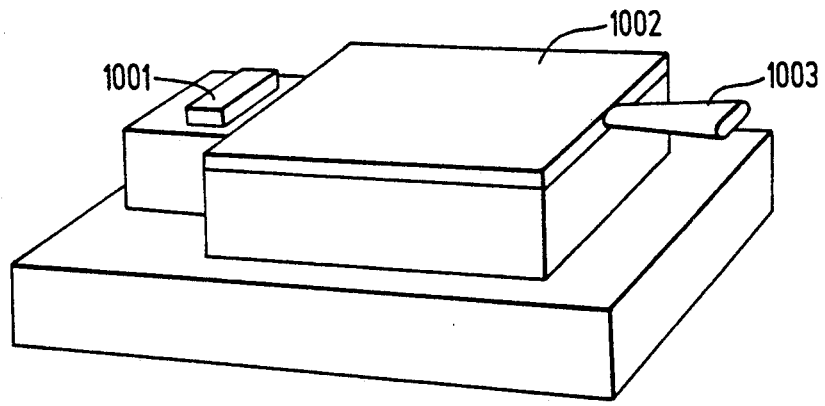
FIG. 10 is a schematic perspective view of a known device emitting blue light.
Figure 11:
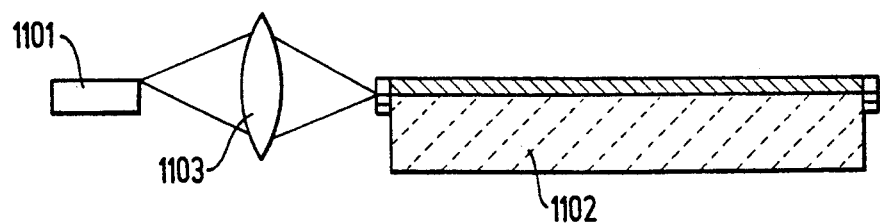
FIG. 11 is a schematic diagram of another known device emitting blue light.

FIG. 9 schematically shows an optical pickup for use with an optical compact disk, the pickup making use of the novel device emitting blue light. The device 901 emitting blue light radiates light of wavelength 435 nm at output power of 5 mW. The light enters a collimator lens 902 and is divided into three beams by a diffraction grating 903. The beams pass through a half prism 904 and are focused onto a disk 906 by a condenser lens 905. The diameter of each spot on the disk is about 0.5 μm. The main beam is diffracted by the pits formed in the surface of the disk. Variations in the amount of reflected light are detected to read out information. The two auxiliary beams are used as tracking control signals. Because the spot diameter is halved as compared with the conventional case in which a semiconductor laser emitting light of wavelength 780 nm, the storage capacity of the disk can be increased by a factor of 4.

EFFECTS OF THE INVENTION

As described thus far, the present invention yields the following advantages.

(1) Because a semiconductor laser and a device for second-harmonic generation are made from compound semiconductors having the same crystalline structure, they can be monolithically integrated. Hence, a quite small-sized blue light-emitting device of about 1 mm square can be realized.

(2) Since the active layer of the semiconductor laser and the nonlinear optical waveguide are formed parallel and flush with each other, most of the laser radiation is introduced into the nonlinear optical waveguide. Consequently, the loss of light is small, and intense blue light can be produced.

(3) Since the semiconductor laser and the device for second-harmonic generation are monolithically integrated, an optical axis alignment step which would normally be needed to guide the laser radiation into the waveguide is dispensed with. Thus, a blue light-emitting device which is easy to fabricate, hence can be fabricated economically, and has good reproducibility can be offered.

(4) Since the semiconductor laser and the device for second-harmonic generation are monolithically integrated, the optical axis is prevented from deviating from its correct position even if the environmental temperature varies or if mechanical vibration occurs. Hence, a quite reliable blue light-emitting device can be obtained.

(5) Since the light guided in the nonlinear optical waveguide is confined not only in the direction of the thickness of the film but also in the direction of the substrate surface, the optical power density is high, and nonlinear interaction of light is sufficiently assured. This improves the efficiency at which the laser light is converted into the second harmonic. As a consequence, strong blue light can be produced.

(6) Since the nonlinear optical waveguide is made of a thin film of a single crystal of a semiconductor of Group II-VI compounds which can be grown on a single crystal substrate of a semiconductor of Group III-V compounds, the laser and the waveguide can be monolithically integrated. The guided light is absorbed or scattered little. This also improves the efficiency at which the laser radiation is converted into the second harmonic. As a result, intense blue light can be produced.

(7) Since the nonlinear optical waveguide is formed by growing thin films by MOCVD that permits the thicknesses of the thin films to be controlled well, the phase matching condition can be satisfied by control of the film thicknesses. Therefore, nonlinear interaction of light takes place efficiently. Hence, a blue light-emitting device in which the laser radiation is converted into the second harmonic at a high efficiency can be manufactured with good reproducibility.

(8) The semiconductor laser is capable of radiating at high power and has a structure of a high quantum efficiency. Hence, intense blue light can be generated.

(9) Where the nonlinear optical waveguide has a superlattice structure, the nonlinear optical constant is large. This further improves the efficiency at which the laser radiation is converted into the second harmonic.

(10) Since the optical waveguide is formed by selective epitaxial growth, the side walls of the waveguide are crystal surfaces and are flat. It is not necessary to etch the semiconductor of Group II-VI compounds to form the waveguide. For these reasons, light is less likely to be scattered on the side walls of the waveguide. The low-loss waveguide can be manufactured easily.

(11) Since a coherent light source of a short wavelength is used, the capacity of the optical memory can be increased by a factor of 4 as compared with the prior art optical memory. Hence, a memory having a large capacity can be realized.

We claim:

1. A light-generating device comprising a laminated laser light-emitting portion for emitting laser light formed on a semiconductor substrate and an optical waveguide optically coupled to the laser light-emitting portion for receiving laser light emitted by the laser light-emitting portion and for producing light at the second harmonic of the light emitted by the laser light-emitting portion, the waveguide being formed on the substrate, the waveguide being constituted by a ridged stripe composed of a thin laminated film, the laser light-emitting portion and the waveguide being substantially flush with each other, wherein said laser light-emitting portion is a thin film of a crystal of a semiconductor consisting of Group III-V compounds, and wherein said optical waveguide for second-harmonic generation is a thin film of a crystal of a semiconductor consisting of Group II-VI compounds.

2. The light-generating device of claim 1, wherein one end surface of the laser light-emitting portion is in contact with one end surface of the optical waveguide.

3. The light-generating device of claim 1, wherein at least one of the opposite end surfaces of the laser light-emitting portion and the optical waveguide is coated with a dielectric film having a thickness giving an optical length equal to half the oscillation wavelength of the laser light-emitting portion.

4. The light-generating device of claim 1, wherein the opposite end surfaces of the laser light-emitting portion and the optical waveguide are spaced from each other by a distance equal to half the oscillation wavelength of the laser light-emitting portion.

5. The light-generating device of claim 1, wherein said optical waveguide for second-harmonic generation comprises: a cladding layer of a semiconductor consisting of Group II-VI compounds; and an optical waveguide of a nonlinear optical medium of a semiconductor that consists of Group II-VI compounds and has a smaller band gap than the semiconductor forming the cladding layer.

6. The light-generating device of claim 1, wherein said optical waveguide for second-harmonic generation has the ridged stripe and consists of the cladding layer and the nonlinear optical waveguide, and wherein the ridged stripe is surrounded by a semiconductor which consists of Group II-VI compounds and which has a smaller refractive index than the semiconductor forming the nonlinear optical waveguide.

7. The light-generating device of claim 1, wherein the film thickness of the nonlinear optical waveguide is so set that the fundamental wave and the second harmonic wave are matched in phase.

8. The light-generating device of claim 1, wherein said optical waveguide for second-harmonic generation is disposed in a channel formed in the semiconductor substrate and substantially flush with the surface of the substrate.

9. The light-generating device of claim 1, wherein a laser resonator comprises the laser light-emitting portion and a reflecting mirror having two opposite end surfaces, the mirror having the optical waveguide for second-harmonic generation therein.

10. The light-generating device of claim 1, wherein said optical waveguide for second-harmonic generation has a multilayer superlattice structure consisting of a semiconductor of Group II-VI compounds.

11. The light-generating device of claim 1, wherein said semiconductor laser comprises an active layer of a semiconductor of Group III-V compounds, a cladding layer, and a contact layer and has a double heterojunction structure, and wherein the semiconductor laser has a ribbed stripe formed by etching away the laminate up to an intermediate depth in the cladding layer overlying the active layer, both side ends of the rib being buried in a layer of a semiconductor consisting of Group II-VI compounds.

12. The light-generating device of claim 1, wherein said layer of the semiconductor of the Group III-V compounds consists of a mixed crystal of AlGaAs.

13. The light-generating device of claim 1, wherein said layer of the semiconductor of the Group III-V compounds consists of a mixed crystal of InGaAsP.

14. A method for manufacturing the light-generating device defined in claim 1, wherein said optical waveguide is formed by selective epitaxial growth of a semiconductor stripe of Group II-VI compounds.

15. The method for manufacturing the light-generating device of claim 14, wherein said selective epitaxial growth is metal organic chemical vapor deposition using organic compounds belonging to Groups II and VI, respectively, as raw materials.

16. The method for manufacturing the light-generating device of claim 14 or 15, wherein said metal organic chemical vapor deposition is carried out under the conditions: (1) the temperature of the substrate is between 300° C. and 700° C. when the thin film of the semiconductor of the Group II-VI compounds is epitaxially grown, (2) the pressure of reacting gas is less than 300 torr, and (3) the molar ratio of the supplied raw material belonging to Group VI to the raw material belonging to Group II is less than 6.

17. The method for manufacturing the light-generating device of claim 14 or 15, comprising the steps of:
growing the double heterojunction crystal on a semiconductor substrate;
etching away portions of the double heterojunction crystal including the active layer perpendicularly to the surface of the substrate;
forming a dielectric film on the etched surface of the substrate;
etching away the dielectric film in the direction of laser resonance to shape the dielectric film into a stripe; and
growing a semiconductor of Group II-VI compounds only on the stripe by said metal organic chemical vapor deposition.

18. The light-generating device of claim 1, wherein the substrate has a surface upon which the waveguide is disposed, the waveguide has a length dimension along which light produced in the waveguide propagates, the substrate and the waveguide each have a width perpendicular to the length dimension and parallel to the substrate surface, and the width of the waveguide is smaller than the width of the substrate.

19. The light-generating device of claim 18 wherein the laser light-emitting portion has a width parallel to the width of the waveguide and smaller than the width of the substrate.

20. An optical memory having a light-emitting device as a light source, the light-emitting device comprising a semiconductor substrate, a laminated laser light-emitting portion consisting of a semiconductor of Group III-V compounds and formed on the substrate, and an optical waveguide, the waveguide being formed on the substrate, the waveguide consisting of a semiconductor of Group II-IV compounds, the waveguide being constituted by a ridged stripe composed of a thin laminated layer, the laser light-emitting portion and the waveguide being substantially flush with each other.

* * * * *